United States Patent
Samara et al.

(10) Patent No.: US 9,847,262 B2
(45) Date of Patent: Dec. 19, 2017

(54) METHOD AND APPARATUS FOR REAL-TIME MONITORING OF PLASMA ETCH UNIFORMITY

(71) Applicant: IMEC VZW, Leuven (BE)

(72) Inventors: Vladimir Samara, Leuven (BE); Jean-Francois de Marneffe, Bossut-Gottechain (BE)

(73) Assignees: IMEC VZW, Leuven (BE); Katholeike Universiteit Leuven, KU Leuven R & D, Leuven (BE)

( * ) Notice: Subject to any disclaimer, the term of this patent is extended or adjusted under 35 U.S.C. 154(b) by 0 days.

(21) Appl. No.: 14/958,771

(22) Filed: Dec. 3, 2015

(65) Prior Publication Data

US 2016/0181165 A1 Jun. 23, 2016

(30) Foreign Application Priority Data

Dec. 22, 2014 (EP) .................................. 14199680

(51) Int. Cl.
*H01L 21/302* (2006.01)
*H01L 21/66* (2006.01)
(Continued)

(52) U.S. Cl.
CPC .............. *H01L 22/12* (2013.01); *G01B 11/30* (2013.01); *H01J 37/32935* (2013.01);
(Continued)

(58) Field of Classification Search
CPC ............... G01B 11/30; H01J 37/32935; H01J 37/32963; H01J 37/32972; H01L 21/3065; H01L 22/12; H01L 22/26; H01L 21/32136
(Continued)

(56) References Cited

U.S. PATENT DOCUMENTS 5,362,356 A  11/1994  Schoenborn
5,405,488 A   4/1995  Dimitrelis et al.
(Continued)

FOREIGN PATENT DOCUMENTS

WO  WO 01/24255 A2   4/2001
WO  WO 03/007327 A2  1/2003
WO  WO 03/027609 A1  4/2003

OTHER PUBLICATIONS

Economou, et al. "Uniformity of Etching in Parallel Plate Plasma Reactors", Journal of the Electrochemical Society, vol. 136, No. 1, Jan. 1, 1989, pp. 188-198.

*Primary Examiner* — Lan Vinh
(74) *Attorney, Agent, or Firm* — Knobbe Martens Olson & Bear, LLP

(57) ABSTRACT

A method is provided for in-situ monitoring of etch uniformity during plasma etching, on the basis of the detection of interferometry patterns. The method is applicable to a reactor wherein a plasma is created in the area between the surface to be etched and a counter-surface arranged essentially parallel to the surface to be etched. The occurrence of interference patterns is detected at a location that is placed laterally with respect to the area between the surface to be etched and the counter-surface. The presence of an interference pattern at a particular wavelength is observed through the detection of oscillations of the light intensity measured by an optical detector, preferably by the standard Optical Emission Spectrometry tool of the reactor. When these oscillations are no longer detectable, non-uniformity exceeds a pre-defined limit. The counter surface is arranged such that the oscillations are detected.

20 Claims, 5 Drawing Sheets

(51) Int. Cl.
H01L 21/3065 (2006.01)
H01J 37/32 (2006.01)
G01B 11/30 (2006.01)

(52) U.S. Cl.
CPC .. H01J 37/32963 (2013.01); H01J 37/32972 (2013.01); H01L 21/3065 (2013.01)

(58) Field of Classification Search
USPC ............ 438/706, 712, 714, 719, 720; 156/345.24, 345.25, 345.47, 345.5, 156/345.51
See application file for complete search history.

(56) References Cited

U.S. PATENT DOCUMENTS

| | | |
|---|---|---|
| 5,450,205 A | 9/1995 | Sawin et al. |
| 6,585,908 B2 | 7/2003 | Cardoso et al. |
| 7,821,655 B2 | 10/2010 | Janos et al. |
| 2002/0048019 A1* | 4/2002 | Sui .................. G01N 21/21 356/369 |
| 2003/0052086 A1* | 3/2003 | Mizumura ........ H01J 37/32935 216/63 |
| 2004/0238489 A1* | 12/2004 | Johnson .............. B81C 1/00587 216/60 |
| 2005/0078300 A1* | 4/2005 | Litvak ................ G01N 21/68 356/72 |
| 2011/0263130 A1* | 10/2011 | Loewenhardt .... H01J 37/32082 438/746 |
| 2012/0196450 A1* | 8/2012 | Balseanu .............. C23C 16/345 438/786 |
| 2013/0104930 A1* | 5/2013 | Shih .................... C11D 7/08 134/1 |

* cited by examiner

METHOD AND APPARATUS FOR REAL-TIME MONITORING OF PLASMA ETCH UNIFORMITY

INCORPORATION BY REFERENCE TO RELATED APPLICATION

Any and all priority claims identified in the Application Data Sheet, or any correction thereto, are hereby incorporated by reference under 37 CFR 1.57. This application claims the benefit of European Application No. EP 14199680.1 filed Dec. 22, 2014. The aforementioned application is incorporated by reference herein in its entirety, and is hereby expressly made a part of this specification.

FIELD OF THE INVENTION

Methods are provided for the determination of etch uniformity during plasma etching of layers on a substrate, such as the etching of photoresist or oxide layers on a silicon wafer.

BACKGROUND OF THE INVENTION

Etch rate and especially etch uniformity of plasma etch processes, i.e. the question of whether or not in some areas of the wafer the etched layer is removed faster than in others, are usually measured by ex-situ techniques. The layer thickness is measured on a number of points across the wafer, for example by ellipsometry, at the start of the process and at various points in time as the etch progresses. This means that the wafer is taken out of the process chamber for each measurement, until a statistical data set is obtained which allows to derive the etch rate and uniformity. Such techniques are cumbersome and time-consuming.

Interferometry has been used as a way to observe the etching process in real-time. Documents U.S. Pat. No. 7,821,655 and U.S. Pat. No. 6,585,908 show examples of techniques for in-situ measurement of the etch rate or for removal endpoint prediction during plasma etching, by analyzing interference patterns through a side window of the reactor. While focusing on the determination of the etch rate, none of these documents discloses an in-situ technique for monitoring the etch uniformity across the wafer.

U.S. Pat. No. 5,450,205 relates to a technique wherein a CCD camera is mounted opposite the substrate during plasma etching. This technique allows to monitor the etch rate and uniformity across the complete substrate surface by analyzing interference patterns. It is however a technically complex solution, which is furthermore not applicable to capacitively coupled plasma etch reactors wherein a plasma is created between two closely spaced electrodes.

SUMMARY OF THE INVENTION

The methods and apparatus of the embodiments can provide for monitoring the etch uniformity of a plasma-based etch process, in real time.

The methods of the embodiments are for monitoring the etch uniformity of a plasma etching process for removing a layer of material from a substrate, the method comprising the steps of: generating a plasma in an area between the layer and a counter-surface mounted opposite the layer and substantially parallel to the layer, thereby progressively removing material from the layer, the plasma emitting light and wherein no other light source is provided besides the plasma, measuring by an optical detector at a lateral location with respect to the area, one or more spectral components of light emitted from the area, arranging the counter-surface relative to the layer so that the optical detector detects oscillations of at least one of the spectral components as a function of time, the oscillations being caused by detected light interference patterns which change due to the progressive removal of material from the layer, and deriving from the oscillations an indication about the etch uniformity of the etch process.

According to an embodiment, the step of deriving an indication of the etch uniformity comprises: determining the moment when oscillations of a particular (e.g., predetermined) spectral component are no longer detected by the optical detector or become smaller than a predefined limit, and concluding at the moment that the etch uniformity is below an acceptable (e.g., predetermined) limit.

The step of deriving an indication of the etch uniformity may further comprise determining an estimation of the degree of non-uniformity at the moment.

According to an embodiment, the optical detector is arranged to receive light from the complete surface of the layer.

According to an embodiment, the step of arranging the counter surface comprises placing the counter surface at a pre-defined distance from the layer, the predefined distance being below a given (e.g., predetermined) limit, wherein no oscillations are detected by the optical detector when the distance is above the limit.

According to an embodiment, the size and material of the counter surface, the size and material of the substrate and the layer, and the distance between the layer and the counter electrode are configured so that the interference patterns are primarily due to reflections of light beams taking place in the area between the layer and the counter surface, the light beams being directed according to the Brewster angle of the material of the counter surface.

Methods of certain of the embodiments may further comprise the step of determining an estimation of the etch rate based on the time span between two consecutive oscillations.

In methods of the certain of the embodiments, the optical detector may comprise an optical fiber configured to receive light emitted from the area and a spectrometer. According to an embodiment, the optical detector are configured for detecting chemical species of the etch products.

The distance between the layer to be removed and the counter surface may be between 2 and 4 cm. According to an embodiment, the material of the counter electrode is the same as the material of the substrate.

In one embodiment, the plasma etching process takes place in a plasma reactor configured for capacitively coupled plasma etching, the reactor comprising a powered electrode and a grounded electrode, the substrate is mounted on the powered electrode, and the counter surface is the surface of the grounded electrode.

In another embodiment, the plasma etching process takes place in a plasma reactor configured for inductively coupled plasma etching, and the counter surface is formed by the surface of the coupling window of the reactor.

According to an embodiment, the light emitted from the area passes through a polarization filter before entering the detector, the filter being configured to admit only light with a given (e.g., predetermined) polarization into the optical detector. The polarization filter may be configured so that only s-polarized light passes the filter.

An apparatus for plasma etching is also provided, comprising: a holder for holding a substrate, the substrate comprising a layer to be etched, a counter surface arranged opposite and facing the layer, when the substrate is mounted on the holder, a device for creating a plasma in the area between the layer and the counter surface (such a plasma creating device, or plasma reactor or generator, may be embodied by any suitable equipment presently used in plasma reactors known in the art), an optical detector for measuring at a lateral location with respect to the area, one or more spectral components of light emitted from the area, wherein the apparatus is further provided with a device for monitoring the etch uniformity by applying the method of any one of the preceding claims. The monitoring device preferably comprises a signal processor and analyzer for manipulating and analyzing signals detected by the optical detector, as well as an output device for producing an output signal, the output signal being translatable into an intervention in the etching process.

The apparatus may further be provided with a polarization filter configured to admit only light with a given polarization into the optical detector. Preferably a filter is applied that admits only s-polarized light.

According to one embodiment, the apparatus is a plasma reactor for capacitively coupled plasma etching, comprising a powered electrode, with the holder mounted on the powered electrode, and a grounded electrode, wherein the surface of the grounded electrode forms the counter surface.

According to another embodiment, the apparatus is a plasma reactor for inductively coupled plasma etching, comprising a coupling window facing the holder, and the counter surface is formed by the surface of the coupling window.

DETAILED DESCRIPTION OF THE EMBODIMENTS

The methods of the embodiments use the detection of interferometry patterns for in-situ monitoring of etch uniformity during plasma etching. The method is applicable to a reactor wherein a plasma is created in the area between the surface to be etched and a counter-surface arranged essentially parallel to the surface to be etched. The interference patterns are detected at a location that is placed laterally with respect to the area between the surface to be etched and the counter-surface. The methods and apparatus of the embodiments are mainly though not exclusively applicable to etching by a capacitively coupled plasma (CCP). In a CCP reactor, a plasma is generated in the gap between two parallel electrodes: a first electrode coupled to an RF power source and a second electrode that is grounded. The wafer with the layer that needs to be etched is mounted on the RF-powered electrode. The counter-surface is formed by the surface of the grounded electrode. The occurrence of interference patterns is detected through a side window of the reactor.

Figure 1:
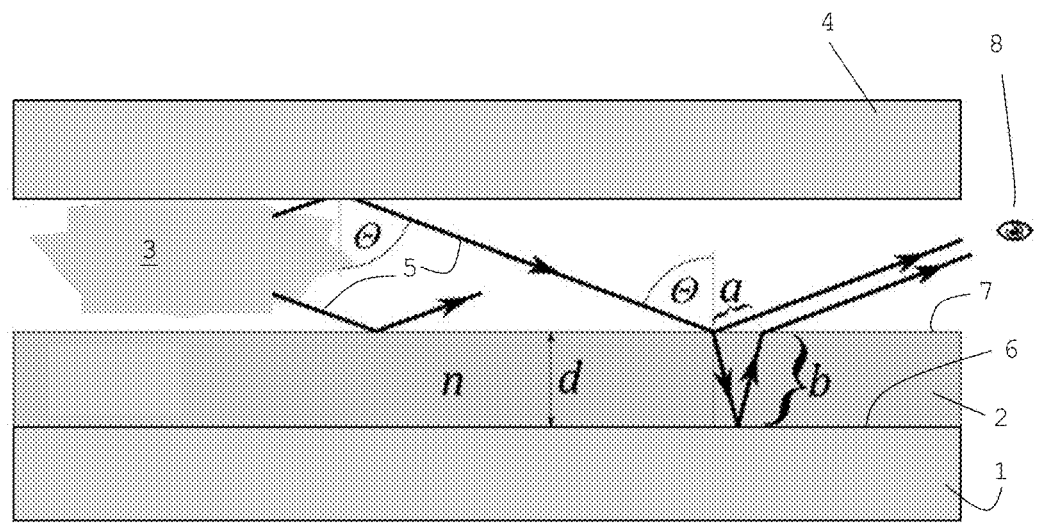
FIG. 1 illustrates the principle of interference patterns appearing during plasma etching of a dielectric layer on a substrate.

The principles behind the appearance of light interference patterns observed in a CCP plasma etching chamber are first briefly summarized with reference to FIG. 1. The figure shows a substrate 1, for example a silicon wafer, covered by a layer 2 that needs to be removed by etching. The wafer 1 is placed on an RF-powered electrode (not shown). Layer 2 can be a photoresist layer for example. Layer 2 has a thickness d and a refraction coefficient n, dependent on the material of the layer. A plasma 3 is generated in the space between the layer 2 and a grounded upper electrode 4.

Interference occurs when a light beam 5 generated by the plasma 3 is partially reflected from the top surface of layer 2 and partially refracted through the layer 2 towards the substrate 1. Refracted light reflects from the substrate surface 6 and gets refracted once again at the plasma-dielectric boundary 7, where it combines with reflected light to form an interference pattern due to the difference in the optical paths of the directly reflected and the refracted light. When the optical difference of the paths ($\Delta s = 2nb-a$) is equal to an integer number of the wavelengths ($\Delta s = N\lambda$), a maximum is observed at location 8, while in the case of the integer plus a half of the wavelength ($\Delta s = (N+\frac{1}{2})\lambda$) a minimum is observed. The difference of the paths is a function of the incidence angle $\Theta$ and the film thickness d according to the formula:

$$\Delta s = 2d\sqrt{n^2 - \sin^2\Theta} \qquad (1)$$

Figure 2:
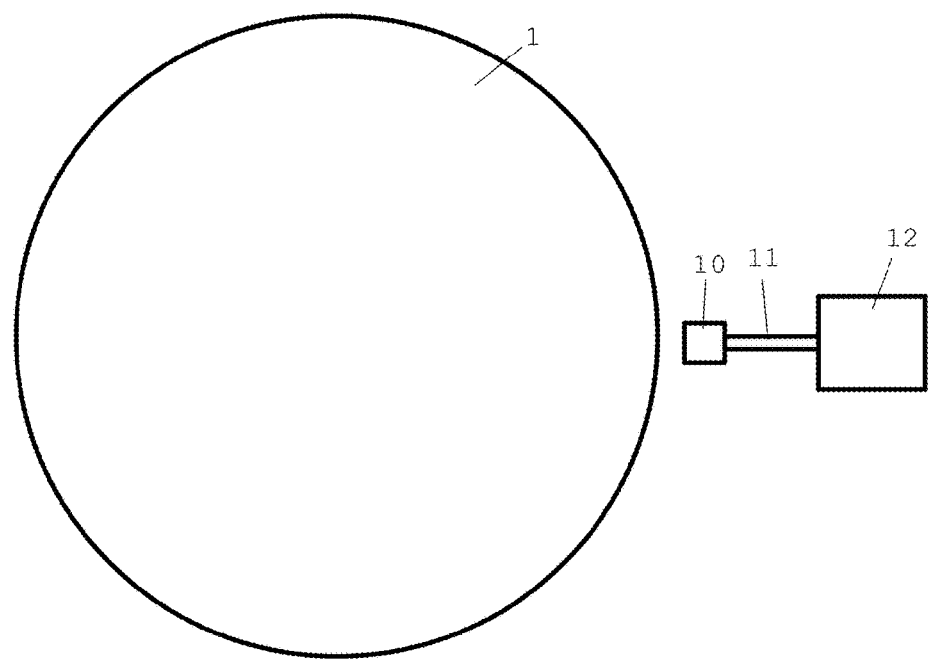
FIG. 2 illustrates the components and position of an optical detection system that is applicable in the method and apparatus of an embodiment.

As will be explained in the description of a number of experiments, the inventors have succeeded in detecting interference patterns in a CCP reactor, wherein the patterns were generated by light from the plasma itself. This is not a self-evident fact. Light is emitted from the plasma in all directions; therefore interference patterns of light coming from various angles are likely to cancel each other. This is why in many prior art methods a directional external light source is used. Moreover, the patterns were detected with the standard Optical Emission Spectroscopy (OES) equipment of the CCP reactor. This OES system is configured for detecting reactive species released from the wafer, in order to monitor the etching process. As illustrated in FIG. 2, it basically comprises a lens 10 coupled to an optical fiber 11 that is itself coupled to a spectrometer 12 for performing a spectral analysis of the light signals received through the fiber. The lens is not focused on a particular point on the surface of layer 2, but it is arranged to receive light from the complete surface of the wafer 1. As there is no focus on a particular point of the wafer, the OES receives light coming from the totality of the wafer's surface, from a plurality of directions. A standard OES of this type is typically provided with a spectral resolution of 1000-2000 pixels and a wavelength range of 200-900 nm.

Figure 3:
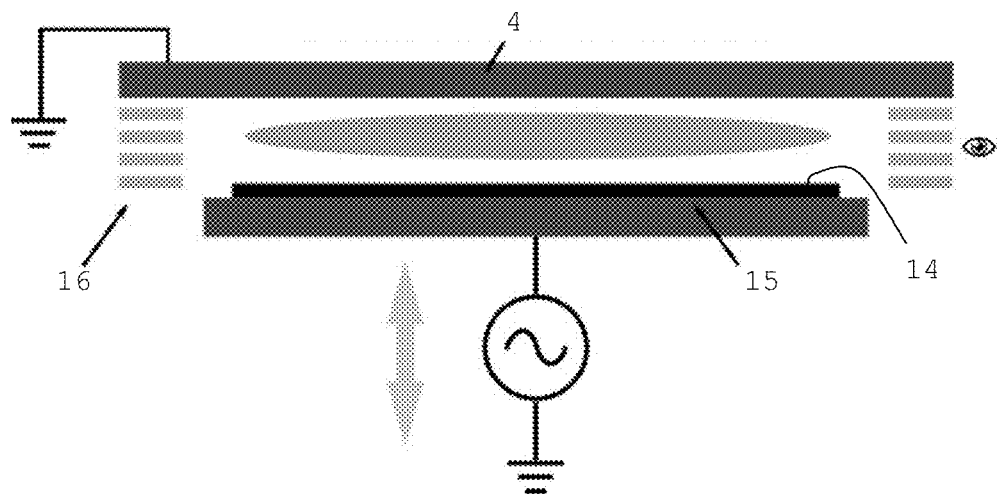
FIG. 3 shows the experimental setup used in a number of experiments relating to an embodiment.

The fact that this OES system is capable of detecting an interference pattern is believed to be linked to the interaction between the reflected and refracted light beams and the counter surface formed by the upper electrode 4 in the embodiments shown in FIGS. 1 and 3. Light striking the upper electrode 4 surface is partly reflected towards the layer 2, and then reflected back to the upper electrode 4. When a sufficient number of reflections can take place between the layer 2 and the upper electrode 4, a detectable interference pattern may be formed. In other words, the counter surface 4 is arranged with respect to the layer 2 in such a manner that the optical detector detects oscillations of at least one of the spectral components as a function of time, the oscillations being caused by detected light interference patterns which change due to the progressive removal of material from the layer 2.

The embodiments reveal for the first time the role played by the counter surface in the appearance of detectable interference patterns generated by the plasma itself. Specifically but not exclusively in the case where a detector is used that receives light coming from the totality of the surface of layer 2, from a plurality of directions, such as the above-described standard OES, a targeted configuration in terms of the counter surface allows the detection of an interference pattern and thereby the monitoring of the etching process. The counter surface is configured so that the interference patterns are primarily due to light beams which have undergone multiple reflections off the counter-surface. According to certain embodiments, one or more parameters of the counter surface itself and/or of the substrate 1 and the layer to be etched 2, in particular the distance between the layer 2 and the counter surface, are optimized in order to maximize the reflection probability and/or the number of reflections taking place off the counter surface, and to thereby maximize the occurrence of observable interference patterns.

The reflection probability off the counter surface 4 depends on the angle of incidence. The highest reflection probability is reached for an angle of incidence referred to as the Brewster angle, which is known for a variety of materials, e.g. the Brewster angle is 74° when the counter surface 4 is formed of silicon. Light with an angle of incidence equal to the Brewster angle thus undergoes more bounces between the wafer and the upper electrode, compared to light at other angles. Although light coming under a different angle can still generate an interference pattern, that pattern is more likely to be cancelled by the antiphase pattern of similar intensity light coming from another angle. The pattern generated by the light at the Brewster angle on the other hand has higher intensity than its antiphase pattern, so the superposition of these two patterns results in a non-zero net interference pattern. Furthermore, the light reflected off the layer 2 and the counter surface 4 is s-polarized, contrary to the non-polarized light emitted directly from the plasma. According to certain embodiments, a polarization filter is provided for filtering light before it enters the OES. An S-filter filters out components that are non-polarized or p-polarized, thereby enhancing the relative intensity of the light that contributes to the interference patterns.

Therefore, according to an embodiment, the size and material of the counter surface 4, the size and material of the substrate 1 and the layer 2 as well as the distance between the layer 2 and the counter surface 4 are configured so that the interference patterns are primarily due to reflections of light beams taking place in the area between the layer 2 and the counter surface 4, the light beams being directed according to the Brewster angle of the material of the counter surface. When the Brewster angle is known, a suitable distance between the layer 2 and the counter surface 4 can be chosen that ensures a high number of reflections at the angle, taking into account the size of the surfaces of layer 2 and the counter surface 4.

It has been found that a direct link can be made between the appearance of an interference pattern for at least one spectral component of emitted plasma light (i.e. one wavelength) during a plasma etch process, and the uniformity of the etch process. A method is therefore provided for monitoring in real time the etch uniformity of a plasma etch process. As long as an interference pattern is observed for light at at least one predetermined wavelength, the process non-uniformity is below a predefined limit. The disappearance of the interferometry pattern indicates that process non-uniformity exceeds the predefined limit. Appropriate actions can then be taken to interrupt and/or correct the process. The presence of an interference pattern at a particular wavelength is observed through the detection of oscillations of the light intensity measured by the OES. When these oscillations are no longer detectable or their amplitude becomes smaller than a given level (e.g. 1% of the amplitude at the start of the etch process), non-uniformity exceeds the pre-defined limit (linked to the wavelength for which the oscillations were observed). This method of monitoring the etch uniformity on the basis of the amplitude of light oscillations caused by interference patterns is not known in the art.

Monitoring a plurality of wavelengths allows not only to determine the moment when non-uniformity becomes unacceptable, but also to estimate the degree of non-uniformity. While an interference pattern is being detected at at least one wavelength, this pattern furthermore allows to determine or at least estimate the etch rate, as will be explained hereafter on the basis of a number of experiments performed by the inventors.

EXAMPLES

Experimental Results

Measurements were performed in a capacitively coupled plasma etch reactor, shown schematically in FIG. 3. The upper grounded electrode 4 was made of silicon. The wafer (not shown) was held by a holder, preferably an electrostatic chuck (ESC) 14 on the lower powered electrode 15. Power was supplied at two frequencies: 27 MHz to control mainly the plasma density, and 2 MHz to control the ion bombardment energy. The substrate electrode could be translated vertically so that the gap between the two electrodes could be varied between 17 and 34 mm. A typical gap used in the experiments was 20 mm. The plasma was surrounded by quartz confinement rings 16. Plasma emission was observed through a fused quartz window on the chamber sidewall (not shown). The OES included an optical fiber used to channel light to a spectrometer equipped with a linear CCD detector installed on the tool, with a wavelength range from 200 nm to 866 nm over 1023 pixels.

300 mm-diameter silicon wafers with a 2000 nm-thick photoresist were used for the experiments. Etching of photoresist was performed at 120 mTorr, 750 W power at 27 MHz, 100 W power at 2 MHz, and 400 sccm $N_2$+400 sccm $H_2$ gas flow.

Figure 4:
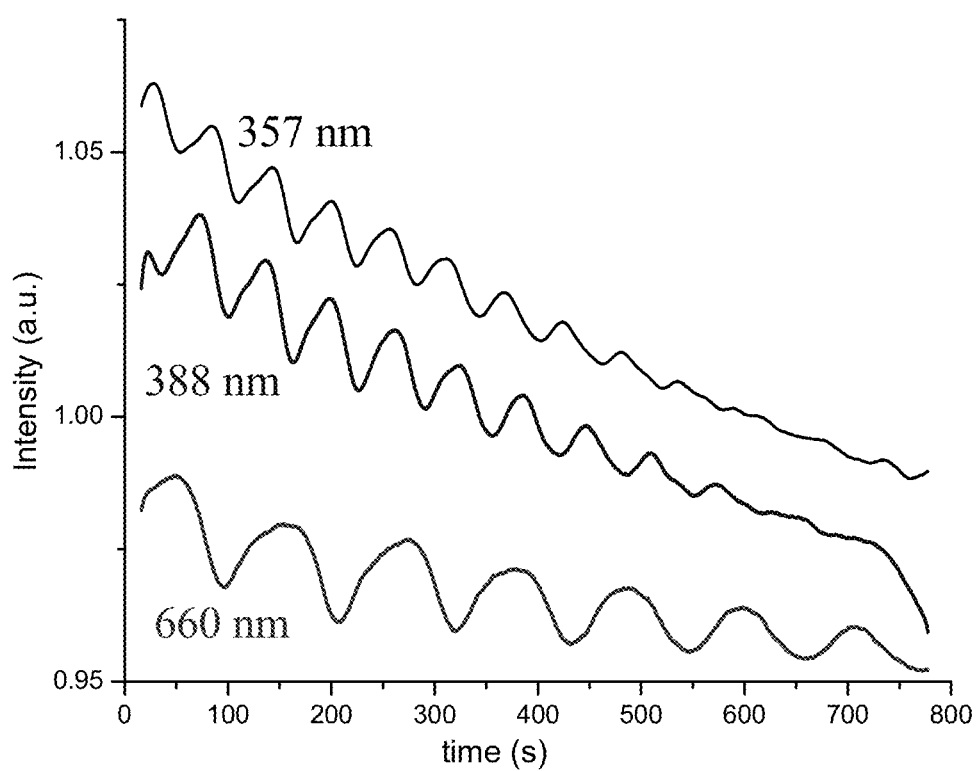
FIG. 4 shows light oscillations at various wavelengths, observed during the experiments (a.u.='arbitrary unit').

While etching a 2000 nm-thick photoresist film, interferometry patterns were observed in the plasma emission spectra as illustrated in FIG. 4 which shows oscillations as a function of time, at various wavelengths, of the light intensity measured by the OES. The oscillations are caused by the gradual thinning of the etched layer 2 whereby the interference patterns go through cyclical changes as a consequence of the above-cited formulas that govern the interference phenomenon. The oscillations had a peak-to-peak amplitude of up to 2% of the average intensity. The oscillations did not change significantly when varying the gap between the electrodes in the range between 17 and 23 mm.

Figure 5:
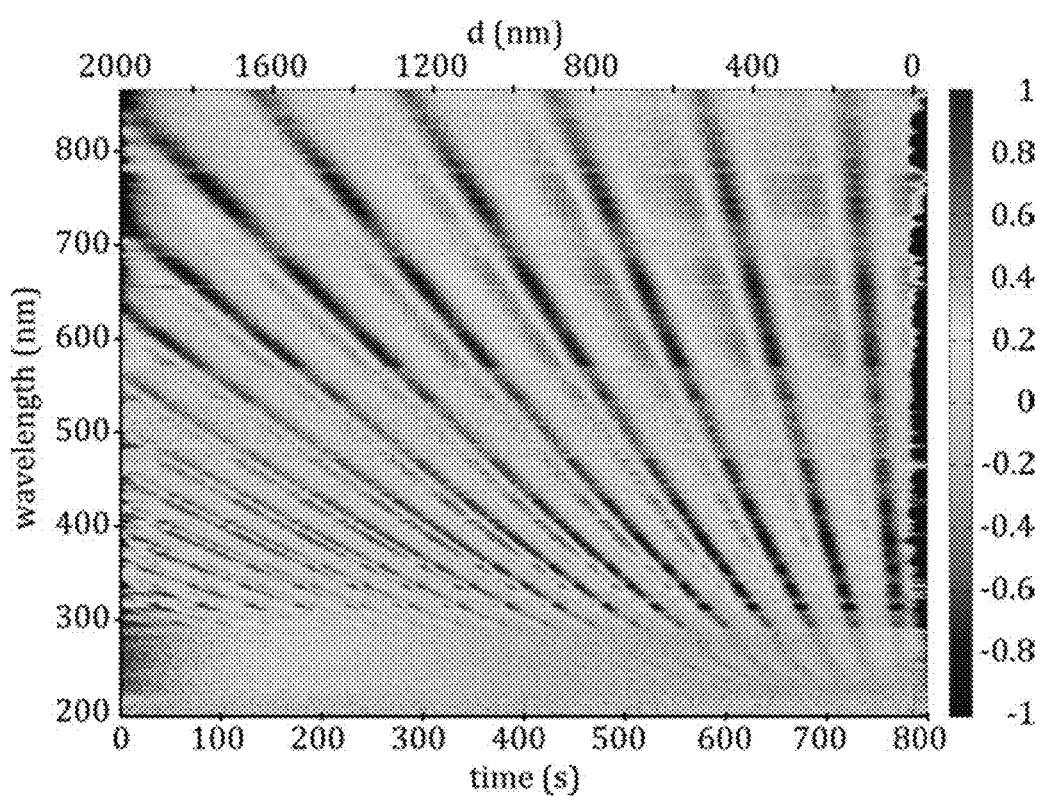
FIG. 5 shows the variation of the observed light intensity during etching of photoresist rescaled to the [−1, 1] interval for each wavelength.

The dependence of the oscillation period on wavelength is even more noticeable in FIG. 5, where intensity is normalized to the [−1, 1] interval, and plotted as a 2D graph with the wavelength on the y-axis and etching time on the x-axis. By assuming that the etch rate is uniform and measuring the film thickness ex-situ by ellipsometry at different times, it is possible to add a film thickness axis (see top of FIG. 5).

Figure 6:
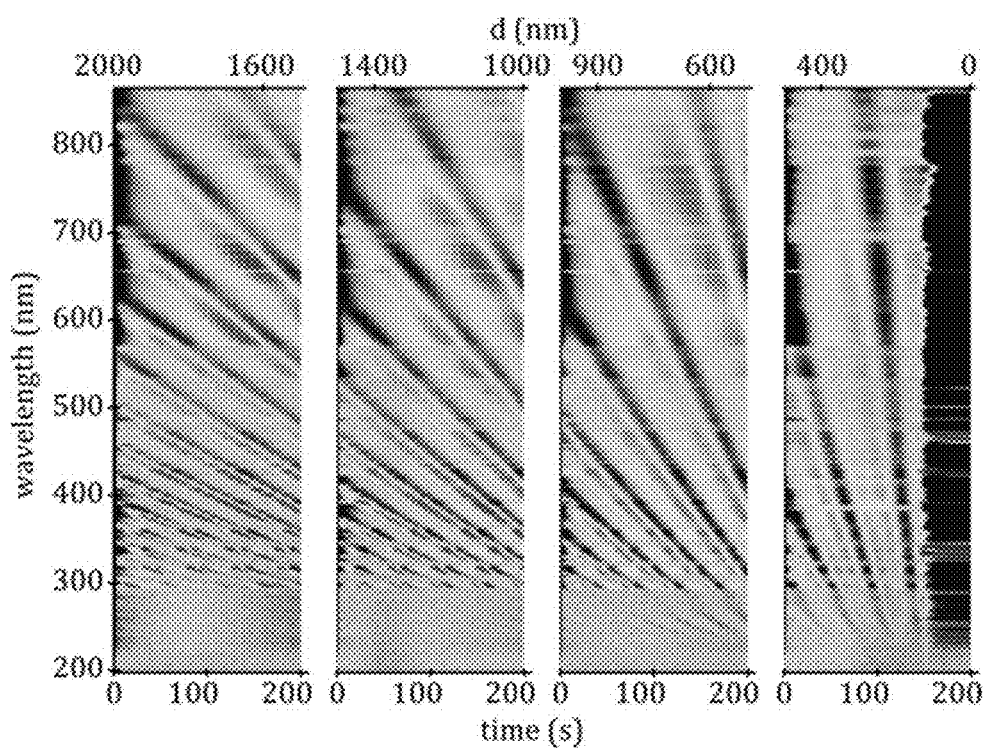
FIG. 6 shows interference patterns for four consecutive etching steps (each 200 s long) of a 2000 nm thick photoresist film.

Another experimental result verifying that the oscillations are due to interference patterns originated from the progressive removal of the film thickness and not to another cause such as plasma oscillations, is shown in FIG. 6. A 2000-nm thick photoresist film was etched at the same conditions as for FIG. 5, except that etching was done in four consecutive steps each lasting 200 s. After each step the film thickness was measured ex-situ by ellipsometry. If the interference pattern was due to plasma oscillations, all four patterns in FIG. 6 would have been identical, which is not the case. Instead, by splicing the patterns in FIG. 6, the overall pattern of FIG. 5 can be reconstructed.

Figure 7:
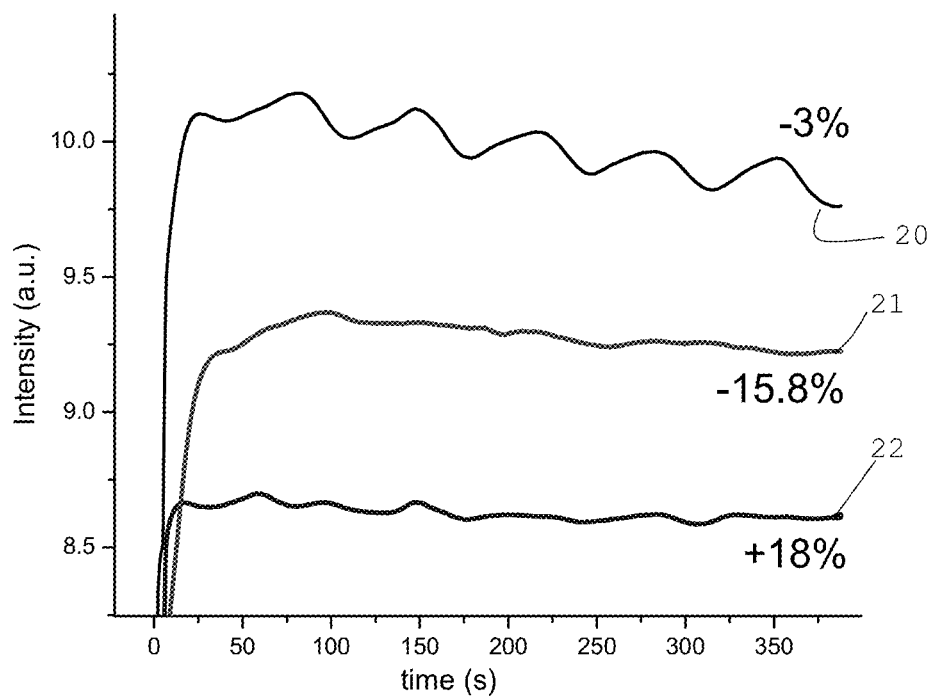
FIG. 7 illustrates the influence of process non-uniformity on the observed oscillations.

FIG. 7 shows the impact of etching non-uniformity on interference. Photoresist (starting thickness 2000 nm), was etched using a $N_2$—$H_2$ based process, modified so as to generate three types of etching outcomes: uniform, center-fast, and edge-fast. This was achieved by using uniformity tuning features of the etching reactor, including flowing additional gases (e.g., $O_2$ and/or $CF_4$) in the edge zone of the upper electrode, or adjusting the center-to-edge temperature difference of the dual-zone electrostatic chuck. The wavelength of the observed light was 387.6 nm. Table 1 shows the thickness difference Δd [center-edge] at the start and after 150 s of etching, for each of the three recipes considered.

TABLE 1

| Wafer | 3σ (%) | Δd [center-edge] (nm) | |
|---|---|---|---|
| | | t = 0 s | t = 150 s |
| 1 | 3 | 15.1 | 4.7 |
| 2 | −15.8 | 19.6 | −121.8 |
| 3 | +18 | 10.0 | +284 |

For a rather uniform etching process (curve 20), oscillations are present from the start, and they persist until the end of etching process. For a non-uniform etching process, oscillations are suppressed almost from the start (curves 21 and 22). For the 3% uniformity case, Δd remains within 15 nm until the end of etching. This is low enough for interference to occur. For both the −15.8% and +18% uniformity cases, the oscillations disappear, hence the non-uniformity is too important and oscillations are no longer detectable.

Following from the above-cited formulas, and as a rough estimation, given the fact that light is integrated from many directions in the OES, the interference pattern is detectable if the film thickness across the wafer does not vary more than about one quarter of the wavelength in the film. This implies that the shorter wavelengths are more sensitive to the uniformity than the long ones, which is clearly visible in FIG. 4, where the interference pattern for 357 nm is lost after 550 s of etching, for 388 nm after 600 s and for 660 nm it is maintained until the end.

By monitoring a plurality of wavelengths, the methods and apparatus of the embodiments allows monitoring the process non-uniformity with respect to a plurality of preset levels. In practice, the moment when the interference pattern is lost can be defined as the moment when the amplitude of the oscillations reaches a predefined ratio (e.g., 1%) of the amplitude at the start of the process. When interference is lost for the smallest wavelength, non-uniformity is known to reach a first preset level in terms of the variation of the film thickness across the wafer, which may still be acceptable. Only when the interference at a higher wavelength is found to be lost, non-uniformity may be found to become unacceptably high. The wavelength at which the oscillations are lost can be used to produce an estimation of the variation as such (namely about a quarter of the wavelength) at the moment the interference pattern at that wavelength disappears. As stated, this is only a rough estimation and if a more accurate determination of the non-uniformity is required, ellipsometry measurements are still advisable. Nevertheless, given the broad range of wavelengths that can be analyzed with a standard OES (e.g. 200-900 nm), this means that the onset of very high levels of non-uniformity can be detected by the method of the embodiments.

Figure 8:
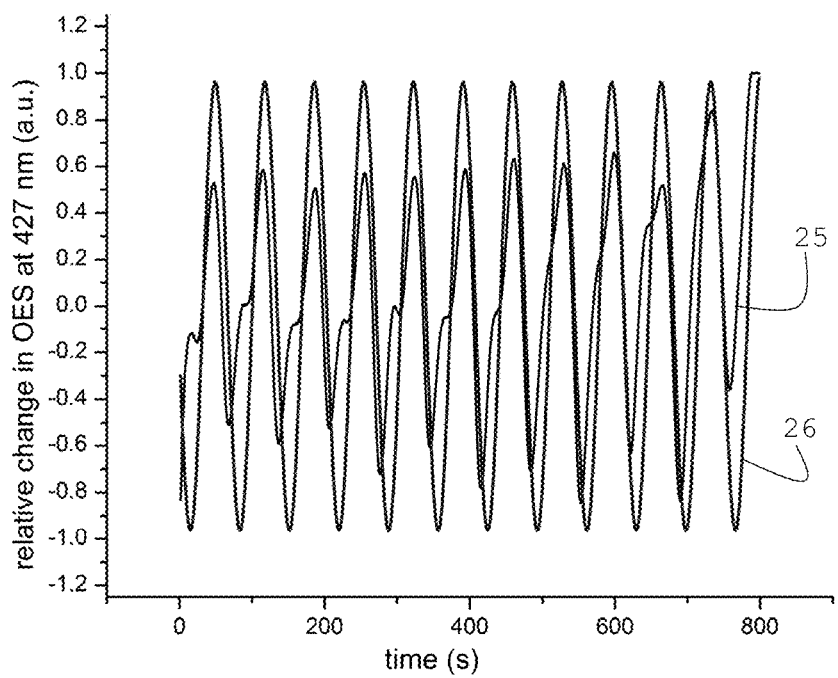
FIG. 8 compares oscillations obtained by experiments with oscillations obtained from a simulation.

The fact that in the performed experiments, the reflections at the Brewster angle were mainly responsible for the appearance of the oscillations was verified by comparing experimental data with simulated data. In the simulation, the interference pattern was calculated using equation (1). The incidence angle used was 74° (the Brewster's angle for Si). The wavelength dependent refractive index of the photoresist was obtained by independent ellipsometric measurements. FIG. 8 compares the experimentally measured oscillations of light at 427 nm wavelength (curve 25) to the simulated oscillations (curve 26). Despite the fact that the experimental interference signal was integrated over the whole wafer with non-uniform photoresist thickness, the agreement between simulation and experimental data is reasonably good.

Figure 9:
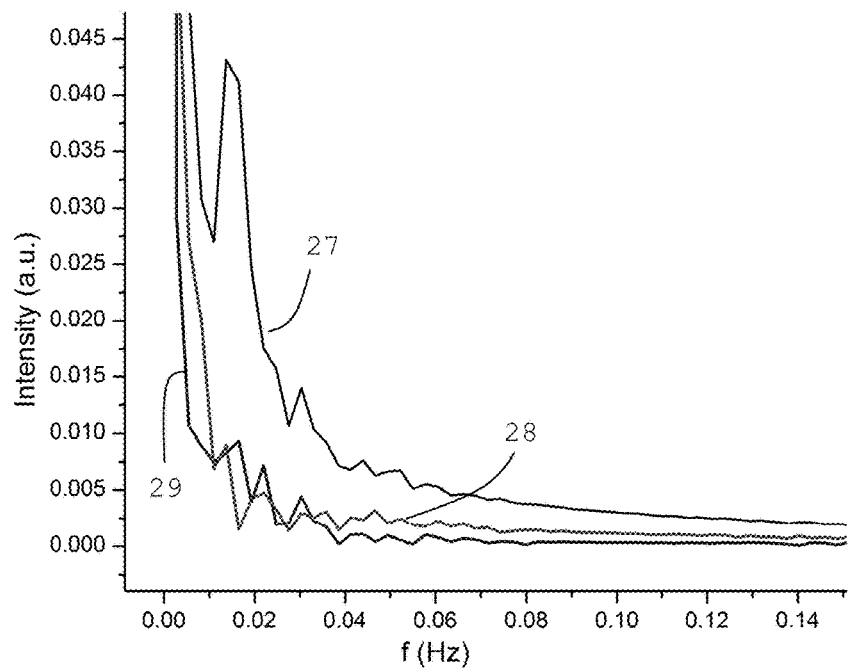
FIG. 9 shows Fast Fourier Transform (FFT) spectra based on the oscillations shown in FIG. 7.

The etch rate can be derived from the measured oscillations shown in FIGS. 4 and 7. In order to extract the frequency components of the OES oscillations, the recorded interferogram can be treated by Fast Fourier transform (FFT). This is illustrated in FIG. 9, using direct raw data as obtained from FIG. 7. Due to the slope in OES signal (caused by pressure drift during processing), there is a large low frequency contribution, however for the uniform case (curve 27) there is a visible peak at f=0.02 Hz, while for non-uniform cases this peak is absent (curves 28/29). Signal correction and filtering, for instance by correcting for the slope or smoothing the curves, allows the interpretation to be refined.

Figure 10:
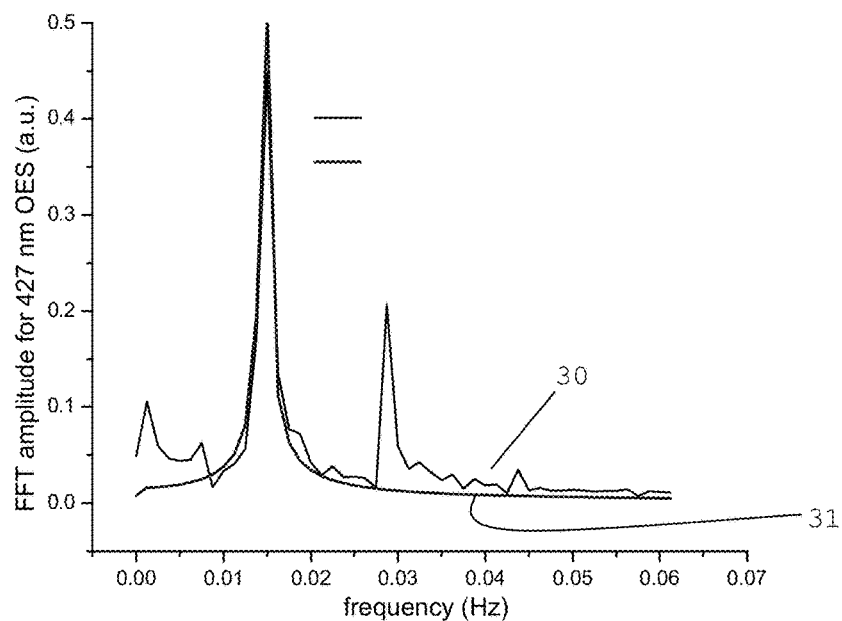
FIG. 10 shows FFT spectra based on the experimental data and on the simulated data from FIG. 8.

Applying FFT analysis to the signals of FIG. 8 (427 nm experimental and simulated) leads to the curves shown in FIG. 10 (30 is the experimental data and 31 the simulated data). The main peak centered at 0.015 Hz corresponds to the main etch. This peak at 0.015 Hz (T=66.67 s) is proportional to the etch rate (ER): ER=D/T, where D is the layer thickness removed in the time span T. D can be calculated from formula (1), on the basis of the known refraction coefficient n and the Brewster angle θ for the upper electrode.

Alternative Embodiments

As stated, the embodiments are mainly applicable to CCP based etching. However, the embodiments are also applicable to other plasma-based etching processes. The role of the upper electrode 4 in the CCP reactor is however important given that the appearance of observable interference patterns is mainly due to the reflections off the upper electrode, as explained above. The distance between the etched layer and the counter-electrode can vary between limits, but it has been found that above a given value of this distance, interference patterns are no longer observable, probably because of an insufficient amount of reflections taking place under the Brewster angle. Therefore, for a given configuration in terms of the material and size of the counter surface 4 and the substrate 1 and layer 2, the distance between the counter surface 4 and the layer 2 at the start of the etching process is preferably chosen below a predefined distance, the predefined distance being below a given limit value, wherein no oscillations are observed when the distance is above the limit. Determination of the limit value may be done by preliminary calibrations tests wherein etching of a layer 2 is performed with varying initial distances between the layer 2 and the counter surface. A preferred range of the inter-electrode distance used in the method of the embodiments is between 2 and 4 cm. Larger distances are however not excluded given that the Brewster angle depends on the material of the upper electrode. Also the size of the surfaces of the electrodes and the substrate as such play a role in whether or not a sufficient amount of reflections can occur.

In an inductively coupled plasma reactor (ICP), a counter electrode is not present, but there is nevertheless a counter-surface in the form of the coupling window of the reactor that faces the layer to be etched. If this window is sufficiently close to the etched layer and the material of this window (usually quartz) provides for a Brewster angle that promotes the appearance of a sufficient amount of reflections between the etched surface and the window, the interference patterns may be observable so as to allow the method of the embodiments to be applied.

The embodiments are applicable to the etching of blanket wafers, i.e. the removal of a layer 2 that has a substantially constant thickness across a substantially flat substrate 1. The embodiments are also applicable to the etching of a patterned wafer, wherein a layer is removed from a substrate that has a certain topography. However, when the step height of the topography becomes too large, this is expected to be detrimental to the appearance of interference patterns.

It is believed to be beneficial that the material of the substrate 1 and the material of the counter-surface (counter-electrode in a CCP process) is the same, for example a silicon wafer 1 and a silicon counter electrode in the setup of FIGS. 1 and 3.

The signal measured by the OES in the experiments was primarily due to s-polarized light, since a large portion of the reflected beams occurs at the Brewster's angle. Thus, by using polarization filters, the emission intensity of the oscillations could be enhanced. Polarization filters can help to separate the light coming directly from the plasma (non-polarized) and the light reflected from the wafer and the top electrode (s-polarized), and this can improve the quality of the detection.

The embodiments are equally related to an apparatus for plasma etching provided with a device for monitoring the etch uniformity by applying the above-described method. This apparatus may take on the form of a plasma reactor, e.g. a standard CCP or ICP etching apparatus provided with an optical detector, e.g. the standard OES as presently provided in these tools, and wherein the monitoring device comprises a signal processor and analyzer for manipulating and analyzing the detected signals. The signal processor and analyzer specifically look for the occurrence of oscillations in one or more spectral components of the incoming signal. The signal processor may be configured to filter, smooth or otherwise treat the signals before the actual analysis of the signal is performed, the analysis comprising at least the verification of whether or not a detectable oscillation as a function of time is present, and the determination of when such a detectable oscillation disappears or becomes smaller than a predefined limit. The monitoring device further comprises an output device for communicating a signal to the control equipment of the etching apparatus, the signal being translatable into an intervention in the etching process, e.g. the interruption of the etching process when a predetermined etch non-uniformity is exceeded. The signal processor and analyzer may further be configured to determine or estimate the etch rate during processing in a manner as described, e.g. smoothing signal, FFT analysis, ER calculation. The signal processor and analyzer and the output device may be tools that are available in the art, and updated, programmed or configured in a manner to achieve the above-described functions. The skilled person is capable of updating, configuring, programming and/or manufacturing a signal processor, analyzer and output device used in an apparatus according to the embodiments.

According to an embodiment, the apparatus is further provided with a polarization filter configured to admit only light with a given polarization into the OES. Preferably a filter is provided that only admits s-polarized light.

While the disclosure has been illustrated and described in detail in the drawings and foregoing description, such illustration and description are to be considered illustrative or exemplary and not restrictive. The disclosure is not limited to the disclosed embodiments. Variations to the disclosed embodiments can be understood and effected by those skilled in the art in practicing the claimed disclosure, from a study of the drawings, the disclosure and the appended claims.

All references cited herein are incorporated herein by reference in their entirety. To the extent publications and patents or patent applications incorporated by reference contradict the disclosure contained in the specification, the specification is intended to supersede and/or take precedence over any such contradictory material.

Unless otherwise defined, all terms (including technical and scientific terms) are to be given their ordinary and customary meaning to a person of ordinary skill in the art, and are not to be limited to a special or customized meaning unless expressly so defined herein. It should be noted that the use of particular terminology when describing certain features or aspects of the disclosure should not be taken to imply that the terminology is being re-defined herein to be restricted to include any specific characteristics of the features or aspects of the disclosure with which that terminology is associated. Terms and phrases used in this application, and variations thereof, especially in the appended claims, unless otherwise expressly stated, should be construed as open ended as opposed to limiting. As examples of the foregoing, the term 'including' should be read to mean 'including, without limitation,' 'including but not limited to,' or the like; the term 'comprising' as used herein is synonymous with 'including,' 'containing,' or 'characterized by,' and is inclusive or open-ended and does not exclude additional, unrecited elements or method steps; the term 'having' should be interpreted as 'having at least;' the term 'includes' should be interpreted as 'includes but is not limited to;' the term 'example' is used to provide exemplary instances of the item in discussion, not an exhaustive or limiting list thereof; adjectives such as 'known', 'normal', 'standard', and terms of similar meaning should not be construed as limiting the item described to a given time period or to an item available as of a given time, but instead should be read to encompass known, normal, or standard technologies that may be available or known now or at any time in the future; and use of terms like 'preferably,' 'preferred,' 'desired,' or 'desirable,' and words of similar meaning should not be understood as implying that certain features are critical, essential, or even important to the structure or function of the invention, but instead as merely intended to highlight alternative or additional features that may or may not be utilized in a particular embodiment of the invention. Likewise, a group of items linked with the conjunction 'and' should not be read as requiring that each and every one of those items be present in the grouping, but rather should be read as 'and/or' unless expressly stated otherwise. Similarly, a group of items linked with the conjunction 'or' should not be read as requiring mutual exclusivity among that group, but rather should be read as 'and/or' unless expressly stated otherwise.

Where a range of values is provided, it is understood that the upper and lower limit, and each intervening value between the upper and lower limit of the range is encompassed within the embodiments.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity. The indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. Any reference signs in the claims should not be construed as limiting the scope.

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

All numbers expressing quantities of ingredients, reaction conditions, and so forth used in the specification are to be understood as being modified in all instances by the term 'about.' Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

Furthermore, although the foregoing has been described in some detail by way of illustrations and examples for purposes of clarity and understanding, it is apparent to those skilled in the art that certain changes and modifications may be practiced. Therefore, the description and examples should not be construed as limiting the scope of the invention to the specific embodiments and examples described herein, but rather to also cover all modification and alternatives coming with the true scope and spirit of the invention.

What is claimed is:

1. A method for monitoring an etch uniformity of a plasma etching process for removing a layer of material from a substrate, wherein the plasma etching process is a capacitively coupled plasma etching process, comprising:
   providing a substrate covered by a layer to be etched, wherein the substrate is placed on a powered electrode;
   generating a plasma in an area between the layer to be etched and a counter-surface comprising a grounded electrode mounted opposite the layer and substantially parallel to the layer, whereby material is progressively removed from the layer in a plasma etching process, the plasma emitting light, wherein no other light source is provided besides the plasma, wherein light striking a surface of the grounded electrode is partially reflected towards the layer, wherein light striking the layer is partially reflected from a top surface of the layer and partially refracted through the layer towards the substrate, and wherein the refracted light reflects from a substrate surface and is refracted once again at the top surface of the layer, where the refracted light combines with the reflected light to form an interference pattern due to a difference in optical paths of the reflected light and the refracted light, wherein the interference patterns are primarily due to light beams which have undergone multiple reflections off the grounded electrode, wherein a size and a material of the counter-surface, a size and a material of the substrate and the layer, and a distance between the layer and the counter surface are each configured so that the light interference patterns are primarily due to reflections of light beams taking place in the area between the layer and the counter-surface, and wherein the light beams are directed according to a Brewster angle of the material of the counter-surface;

measuring, by an optical emission spectroscopy detector at a lateral location with respect to the area, one or more spectral components of light emitted from the area wherein the emission spectroscopy detector comprises a lens coupled to an optical fiber that is coupled to a spectrometer, wherein the lens is arranged to receive light from a totality of the top surface of the layer from a plurality of directions, wherein the light emitted from the area passes through a polarization filter before entering the optical detector, wherein the filter is configured to admit only light with a given polarization into the optical detector, wherein the polarization filter is configured so that only s-polarized light passes the polarization filter;

arranging the counter-surface relative to the layer so that the optical detector detects oscillations of at least one of the one or more spectral components as a function of time, the oscillations being caused by detected light interference patterns which change due to the progressive removal of the material from the layer; and deriving, from the oscillations, an indication about an etch uniformity of the plasma etching process.

2. The method of claim 1, wherein deriving, from the oscillations, an indication of the etch uniformity comprises:
determining a moment when oscillations of a particular spectral component are no longer detected by the optical detector or become smaller than 1% of an amplitude at the start of the plasma etching process; and
concluding at the moment that the etch uniformity is unacceptable and interrupting the plasma etching process.

3. The method of claim 2, wherein deriving, from the oscillations, an indication about an etch uniformity of the plasma etching process further comprises determining an estimation of a degree of non-uniformity at the moment.

4. The method of claim 1, wherein arranging the counter-surface relative to the layer comprises placing the counter surface at a pre-defined distance from the layer at which oscillations are detected by the optical detector.

5. The method of claim 1, further comprising determining an estimation of an etch rate based on a time span between two consecutive oscillations.

6. The method of claim 1, wherein the optical detector is configured for detecting chemical species of etch products.

7. The method of claim 1, wherein the distance between the layer to be removed and the counter-surface is between 2 cm and 4 cm.

8. The method of claim 1, wherein the material of the counter-surface is the same as the material of the substrate.

9. The method of claim 1, wherein the plasma etching process takes place in a plasma reactor configured for capacitively coupled plasma etching, the reactor comprising a powered electrode and a grounded electrode, wherein the substrate is mounted on the powered electrode and wherein the counter-surface is a surface of the grounded electrode.

10. The method of claim 1, wherein the plasma etching process takes place in a plasma reactor configured for inductively coupled plasma etching, and wherein the counter-surface is formed by a surface of the coupling window of the plasma reactor.

11. The method of claim 1, wherein deriving, from the oscillations, an indication of the etch uniformity comprises:
determining a moment when oscillations of a particular spectral component are detected by the optical detector or are larger than 1% of an amplitude at the start of the plasma etching process; and
concluding at the moment that the etch uniformity is acceptable and continuing the plasma etching process.

12. The method of claim 1, wherein an estimation of a level of non-uniformity for the layer is obtained by monitoring spectral components having wavelengths including a smallest wavelength and a highest wavelength, wherein a loss of interference at the smallest wavelength indicates an acceptable degree of non-uniformity, and wherein a loss of interference at the highest wavelength indicates and unacceptable degree of non-uniformity.

13. The method of claim 1, wherein an estimation of etch rate is obtained by applying a fast Fourier transform to an interferogram to obtain a curve with a main peak corresponding to a main etch, wherein the main peak is proportional to the etch rate corresponding to a thickness D of the layer removed in a time span T.

14. The method of claim 1, wherein an inter-electrode distance between the powered electrode and the grounded electrode is between 2 and 4 cm, and wherein a material of the substrate and the material of the grounded electrode is the same.

15. An apparatus for plasma etching, comprising:
a holder configured for holding a substrate, the substrate comprising a layer to be etched;
a counter-surface arranged opposite and facing the layer, when the substrate is mounted on the holder;
a device configured for creating a plasma in an area between the layer and the counter-surface; and
an optical detector configured for measuring, at a lateral location with respect to the area, one or more spectral components of light emitted from the area;
wherein the apparatus is further provided with a device configured for monitoring an etch uniformity of a plasma etching process by applying the method of claim 1.

16. The apparatus of claim 15, wherein the apparatus is a plasma reactor configured for capacitively coupled plasma etching, the plasma reactor comprising a powered electrode and a grounded electrode, wherein the holder is mounted on the powered electrode, and wherein a surface of the grounded electrode forms the counter surface.

17. The apparatus of claim 15, wherein the apparatus is a plasma reactor configured for inductively coupled plasma etching, the plasma reactor comprising a coupling window facing the holder, wherein the counter-surface is formed by a surface of the coupling window.

18. The apparatus of claim 15, wherein the monitoring device comprises a signal processor and an analyzer configured for manipulating and analyzing signals detected by the optical detector, and an output device configured for producing an output signal, the output signal being translatable into an intervention in the plasma etching process.

19. The apparatus of claim 18, further comprising a polarization filter configured to admit only light with a given polarization into the optical detector.

20. The apparatus of claim 19, wherein the polarization filter is configured so that only s-polarized light passes the filter.

* * * * *

UNITED STATES PATENT AND TRADEMARK OFFICE
CERTIFICATE OF CORRECTION

PATENT NO. : 9,847,262 B2
APPLICATION NO. : 14/958771
DATED : December 19, 2017
INVENTOR(S) : Vladimir Samara et al.

It is certified that error appears in the above-identified patent and that said Letters Patent is hereby corrected as shown below:

In the Claims

In Column 13 at Line 9, In Claim 1, change "area" to --area,--.

Signed and Sealed this
Seventeenth Day of April, 2018

Andrei Iancu
*Director of the United States Patent and Trademark Office*